United States Patent
Chen et al.

(10) Patent No.: US 8,169,209 B2
(45) Date of Patent: May 1, 2012

(54) OUTPUT DRIVING CIRCUIT CAPABLE OF REDUCING EMI EFFECT

(75) Inventors: Fu-Yuan Chen, Kao-Hsiung Hsien (TW); Yu-Chen Chiang, Changhua County (TW); Ming-Hung Chang, Hsin-Chu Hsien (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 374 days.

(21) Appl. No.: 12/687,094

(22) Filed: Jan. 13, 2010

(65) Prior Publication Data
US 2011/0074376 A1  Mar. 31, 2011

(30) Foreign Application Priority Data

Sep. 30, 2009 (TW) ................................ 98133140 A

(51) Int. Cl.
*G05F 1/00* (2006.01)

(52) U.S. Cl. .................... 323/289; 323/271; 323/283

(58) Field of Classification Search .................. 323/271, 323/283, 289
See application file for complete search history.

(56) References Cited

U.S. PATENT DOCUMENTS

| | | | | |
|---|---|---|---|---|
| 6,255,867 | B1 * | 7/2001 | Chen | 327/108 |
| 6,437,611 | B1 * | 8/2002 | Hsiao et al. | 327/108 |
| 6,979,981 | B2 * | 12/2005 | Yoshikawa | 323/225 |
| 7,265,526 | B2 * | 9/2007 | Yoshikawa | 323/282 |
| 7,408,334 | B2 * | 8/2008 | Manabe et al. | 323/283 |
| 7,675,276 | B2 * | 3/2010 | Ohkawa et al. | 323/271 |

* cited by examiner

*Primary Examiner* — Adolf Berhane
*Assistant Examiner* — Gary Nash
(74) *Attorney, Agent, or Firm* — Winston Hsu; Scott Margo

(57) ABSTRACT

An output driving circuit capable of reducing EMI effect includes a non-overlapping signal generation unit for generating a first non-overlapping signal and a second non-overlapping signal according to an input signal, a pre-driver for generating a first pre-driving signal and a second pre-driving signal according to the first non-overlapping signal and the second non-overlapping signal, a high-side switch, a low-side switch, and a control unit for controlling the high-side switch or the low-side switch to be switched into a weak on state to reduce load inductive current effect for a load.

17 Claims, 9 Drawing Sheets

US 8,169,209 B2

OUTPUT DRIVING CIRCUIT CAPABLE OF REDUCING EMI EFFECT

BACKGROUND OF THE INVENTION

1. Field of the Invention

The present invention relates to an output driving circuit, and more particularly, to an output driving circuit capable of reducing the inductive current effect and preventing EMI accordingly.

2. Description of the Prior Art

A class D power amplifier offers advantages of small size, high efficiency, and energy savings so that the class D power amplifier has widely been applied in various electronic products, such as notebooks, LCD monitors, mobile phones, and multimedia players, etc.

The class D amplifier adopts a Pulse-Width Modulation (PWM) technology for signal modulation. However, such switching operation of the class D amplifier can easily cause an electromagnetic Interference (EMI) problem. Please refer to FIG. 1, which is a schematic diagram of an output driving circuit 10 according to the prior art. The output driving circuit 10 is utilized for a class D power amplifier. The output driving circuit 10 includes a non-overlapping signal generation unit 102, a first pre-driving circuit 104, a second pre-driving circuit 106, and an output stage 108. The non-overlapping signal generation unit 102 is utilized for generating a first non-overlapping signal $S_1$ and a second non-overlapping signal $S_2$ according to a PWM type input signal $S_1$ in order to prevent transistors of the output stage 108 from conducting at the same time. The first pre-driving circuit 104 is utilized for generating a first pre-driving signal $S_{P1}$ according to the first non-overlapping signal $S_1$ to control an on/off state of a high-side switch HS of the output stage 108. The second pre-driving circuit 106 is utilized for generating a second pre-driving signal $S_{P2}$ according to the second non-overlapping signal $S_2$ to control an on/off state of a low-side switch LS of the output stage 108. As shown in FIG. 1, a bootstrap configuration is adopted to the output driving circuit 10, so that a bootstrap power supply BS is provided to the first pre-driving circuit 104 and a power supply VDD is provided to the second pre-driving circuit 106. Furthermore, the first pre-driving circuit 104 and the second pre-driving circuit 106 are respectively an inverter circuit with a combination of p-type and n-type metal-oxide-semiconductor (MOS) transistors. The output stage 108 outputs an output signal $S_O$ via an output end OUT to a load 110. The interconnections of the units of the output driving circuit 10 are as shown in FIG. 1 and further description is omitted for brevity.

In general, through the control of the non-overlapping signal generation unit 102, both the high-side switch HS and low-side switch LS are able to be switched into an off state before either one switch is turned on, and there is a short time interval, called non-overlap time, in which both the switches HS and LS are in the off state. IF the load 110 is an inductive load, such as a speaker, a current called load inductive current in the load 10 cannot change instantaneously during the non-overlap time. In such a condition, the load inductive current must continue to flow so that parasitic diodes of the high-side switch HS and the low-side switch LS may be conducted for serving as discharge paths in order to leak the load inductive current.

For example, please refer to the FIG. 2(A), as the input signal $S_1$ is changed from a low voltage level (Low) to a high voltage level (High), the second pre-driving signal $S_{P2}$ can be pulled down from the high voltage level. After that, the gate voltage $V_{GSL}$ of the low-side switch LS can be pulled down from the high voltage level accordingly and during the time interval T1, the low-side switch LS is switched into an off state. Furthermore, during the time interval T1, the first pre-driving signal $S_{P1}$ can be progressively pulled up from the low voltage level. The gate voltage $V_{GSU}$ of the high-side switch HS can be pulled up from the low voltage level later accordingly, and the high-side switch HS is switched into an on state during the time interval T2. In other words, during a short duration of the time interval T1, both the high-side switch HS and high-side switch HS are in the off state, currents in the load 10 cannot change instantaneously, resulting in a load inductive current $I_{L1}$ flowing at a direction from the load 110 to the output end OUT. In such a condition, the voltage value on the output end OUT will rise up due to the load inductive current $I_{L1}$ and a parasitic diode PD1 of the high-side switch HS can be conducted accordingly for serving as a current path.

However, when the load inductive current $I_{L1}$ passes through the parasitic diode $P_{D1}$, the voltage level on the output end OUT will be suddenly pulled up to the high voltage level. In other words, the output signal $S_O$ is switched into the high voltage level rapidly so that the output stage 108 has a very high output slew rate, and the EMI occurs. Similarly, please refer to the FIG. 2(B), as the input signal SI is changed from High to Low, a load inductive current $I_{L2}$ flowing at a direction from the output end OUT to the load 110 occurs during the non-overlap time, a parasitic diode PD2 of the low-side switch LS can be conducted by the load inductive current $I_{L2}$ for serving as a current path. Therefore, the voltage level on the output end OUT will be suddenly pulled down to the low voltage level. The output signal $S_O$ is rapidly switched into the low voltage level, resulting in a very high output slew rate, and the EMI occurs. In short, the output stage 108 may have a high output slew rate due to the rapid switching of the output signal $S_O$ so as to introduce the EMI problem. Moreover, almost all current electronic products are demanded to meet some international EMI standards, such as FCC, CE, etc. Therefore, how to figure out an appropriate solution for reducing the EMI emission generated from the operation of the output driving circuit 10 should be a concern in the progressive circuit design.

SUMMARY OF THE INVENTION

It is therefore a primary objective of the present invention to provide an output driving circuit capable of reducing EMI effect.

The present invention discloses an output driving circuit capable of reducing EMI effect. The output driving circuit includes a non-overlapping signal generation unit, a pre-driver, a high-side switch, a low-side switch, an output end, and a control unit. The non-overlapping signal generation unit is utilized for generating a first non-overlapping signal and a second non-overlapping signal according to an input signal. The pre-driver is coupled to the non-overlapping signal generation unit for generating a first pre-driving signal and a second pre-driving signal according to the first non-overlapping signal and the second non-overlapping signal. The high-side switch includes a first terminal coupled to the pre-driver for receiving the first pre-driving signal, a second terminal coupled to a first power end and a third terminal for controlling an electrical connection between the second terminal of the high-side switch and the third terminal end of high-side switch. The low-side switch includes a first terminal coupled to the pre-driver for receiving the second pre-driving signal, a second terminal, and a third terminal coupled to a ground end for controlling an electrical connection between the second terminal of the low-side switch and the third terminal end of the low-side switch. The output end is coupled to the third terminal of the high-side switch, the second terminal of the low-side switch, and a load, for outputting an output signal. The control unit is coupled to the non-overlapping signal generation unit, the high-side switch, and the low-side switch for controlling the high-side switch or the low-side switch to be switched into a weak on state to reduce load inductive current effect caused by the load according to the first non-overlapping signal, the second non-overlapping signal, the first pre-driving signal and the second pre-driving signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
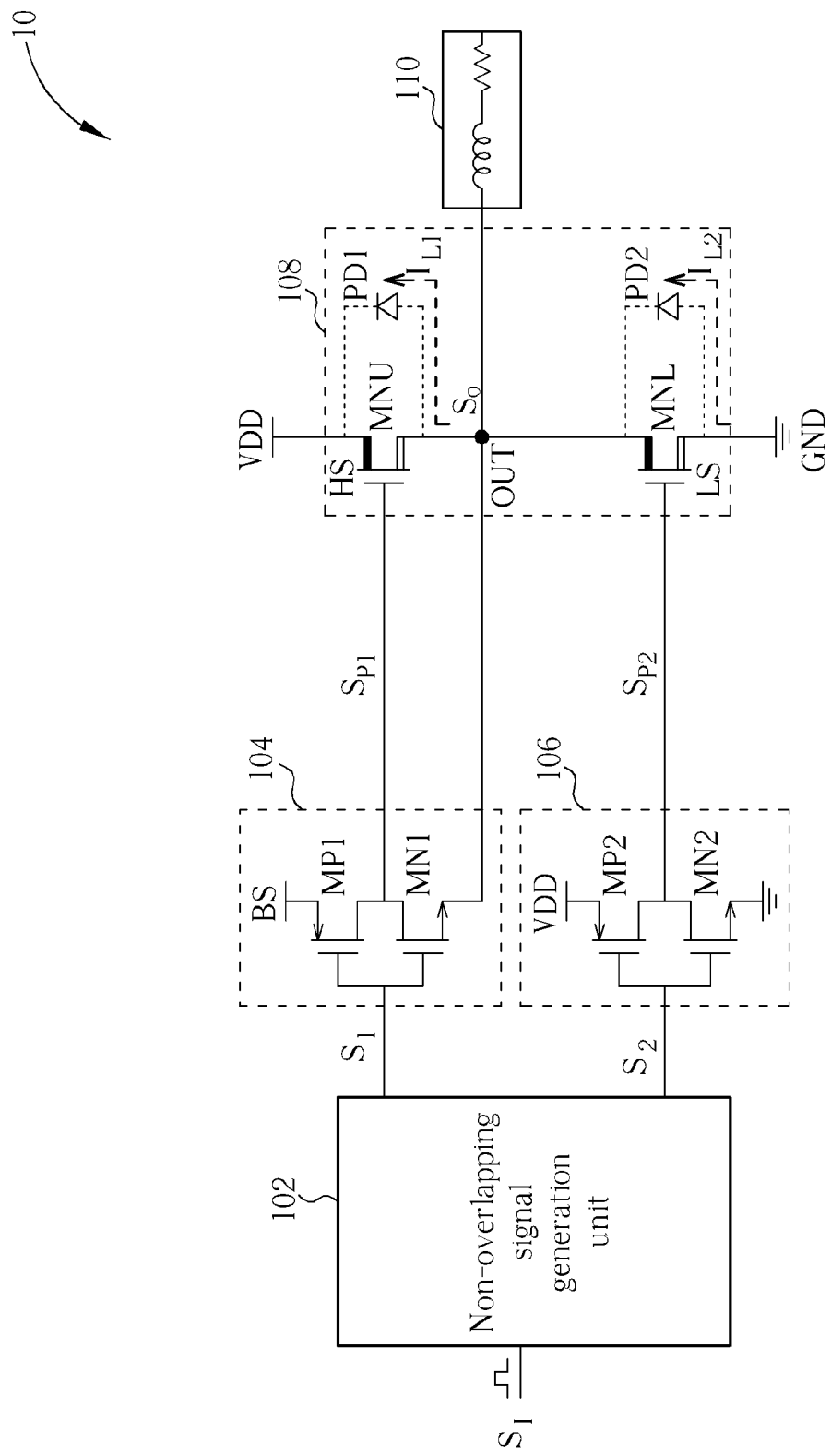
FIG. 1 is a schematic diagram of an output driving circuit according to the prior art.
Figure 2A:
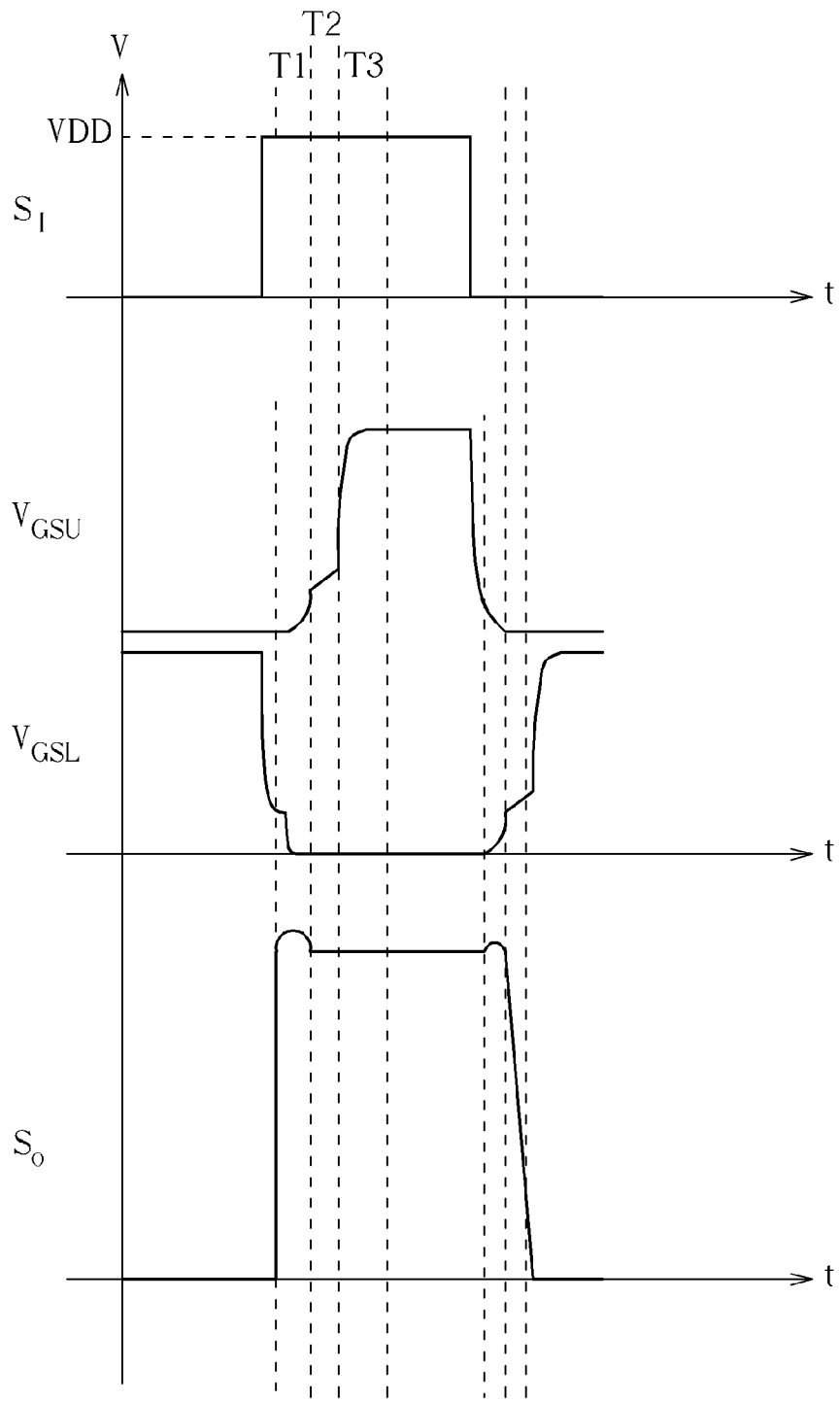
FIG. 2(A) and FIG. 2(B) are schematic diagrams of signal waveforms of the output driving circuit shown in FIG. 1.
Figure 2B:
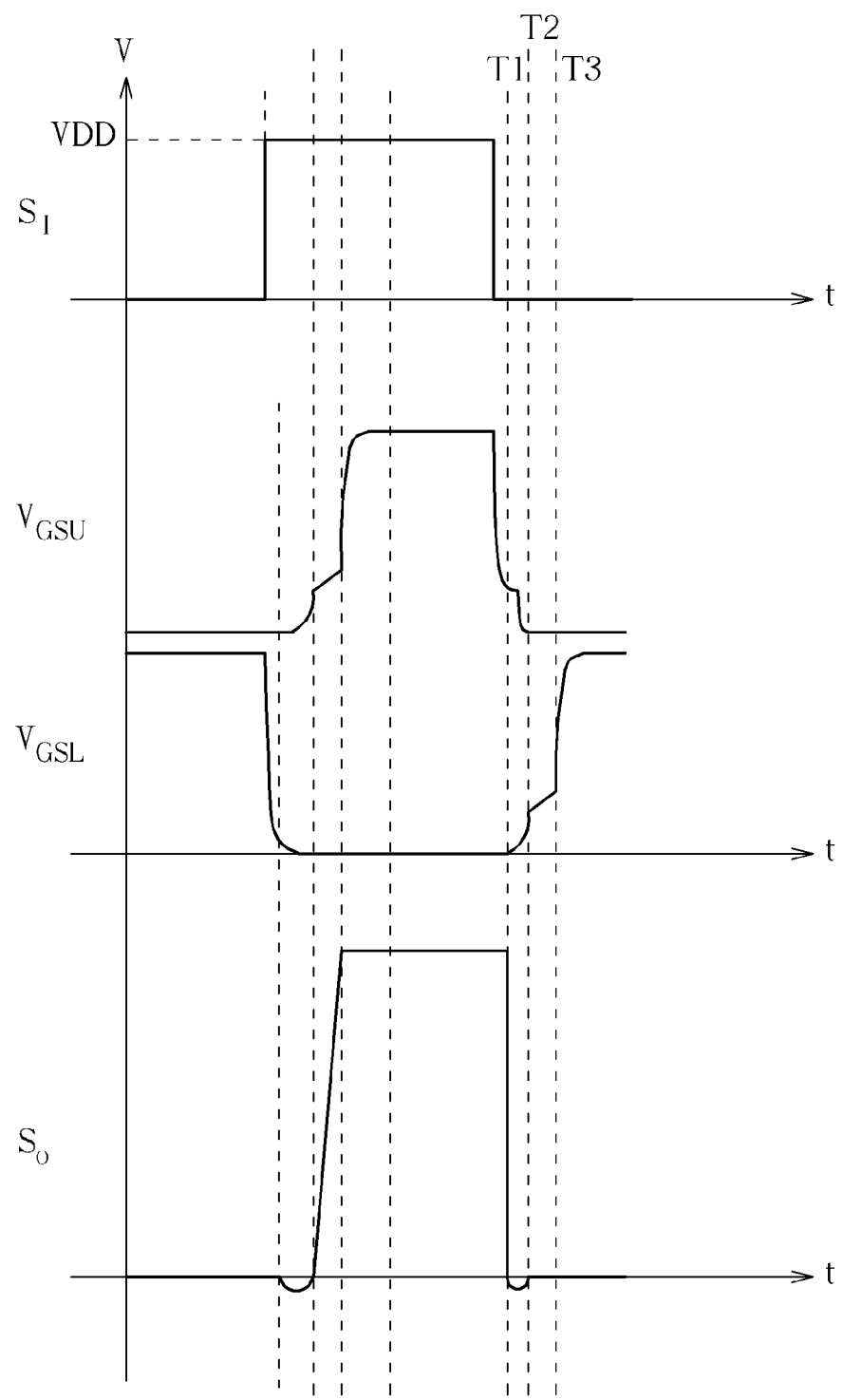
Figure 3:
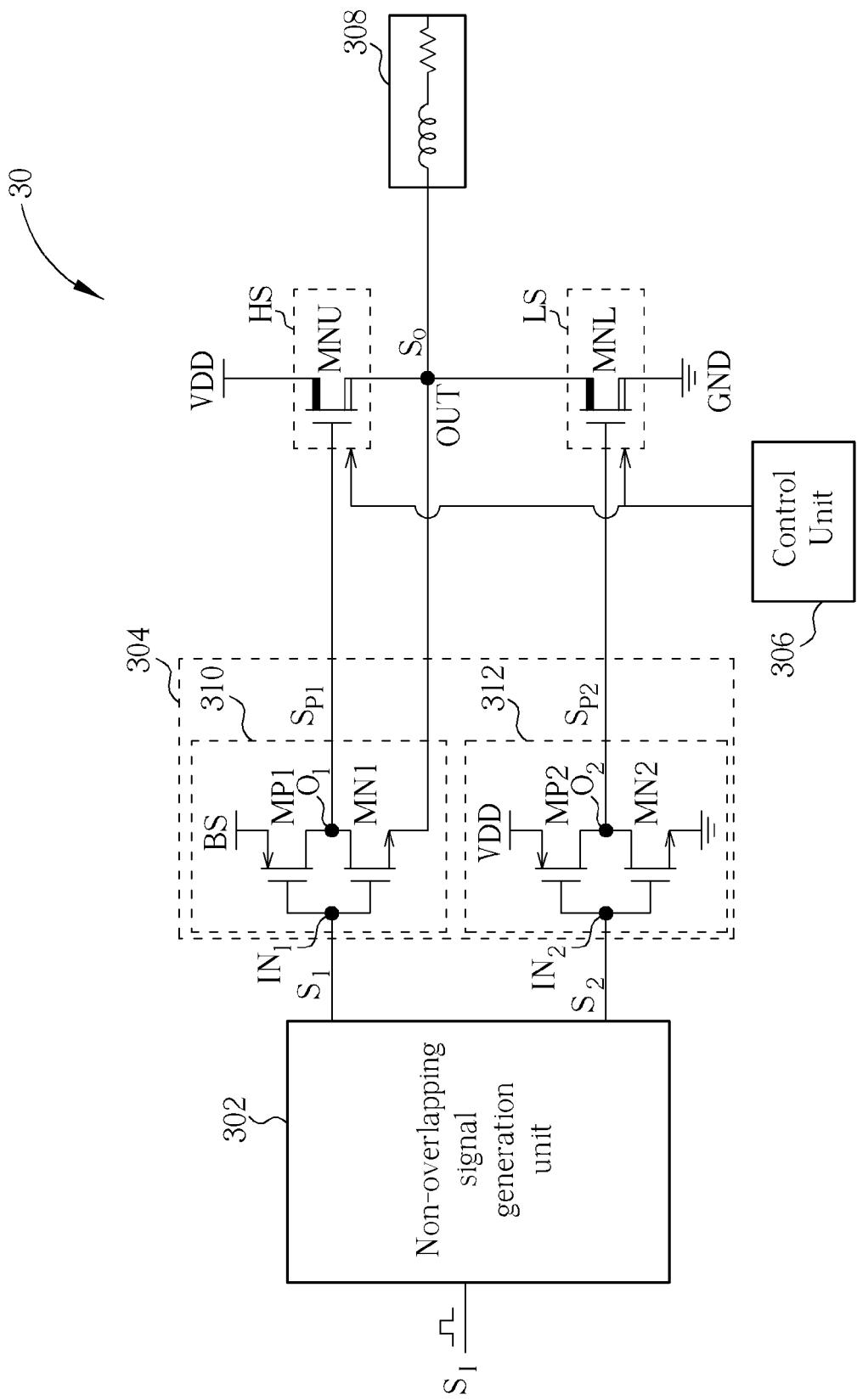
FIG. 3 is a schematic diagram of an output driving circuit according to a first embodiment of the present invention.

Please refer to FIG. 3, which is a schematic diagram of an output driving circuit 30 according to a first embodiment of the present invention. The output driving circuit 30 is preferably utilized for a class D amplifier circuit. The output driving circuit 30 includes a non-overlapping signal generation unit 302, a pre-driver 304, a high-side switch HS, a low-side switch LS, a control unit 306, a load 308 and an output end OUT. The non-overlapping signal generation unit 302 is utilized for generating a first non-overlapping signal $S_1$ and a second non-overlapping signal $S_2$ according to an input signal $S_1$. The pre-driver 304 includes a first pre-driver 310 and a second pre-driver 312 which are respectively utilized for generating a first pre-driving signal $S_{P1}$ and a second pre-driving signal $S_{P2}$ according to the first non-overlapping signal $S_1$ and the second non-overlapping signal $S_2$. As shown in FIG. 3, the pre-driver 304 is operated with a bootstrap scheme, a bootstrap power supply BS is provided to the first pre-driver 310 and a power supply VDD is provided to the second pre-driver 312 accordingly. Preferably, the first pre-driver 310 can be implemented by an inverter circuit with a combination of a p-type MOS transistor MP1 and an n-type MOS transistor MN1. In the first pre-driver 310, the first non-overlapping signal $S_1$ is received via a first input end $IN_1$ and the first pre-driving signal $S_{P1}$ is outputted via a first output end $O_1$. Similarly, the second pre-driver 312 can be implemented by an inverter circuit with a combination of a p-type MOS transistor MP2 and an n-type MOS transistor MN2. In the second pre-driver 312, the second non-overlapping signal $S_2$ is received via a second input end $IN_2$ and the second pre-driving signal $S_{P2}$ is outputted via a second output end $O_2$. The interconnections of the units above-mentioned are as shown in FIG. 3 and further description is omitted for brevity.

Furthermore, in the output driving circuit 30, the high side-switch HS and the low-side switch LS are respectively coupled to the first output end $O_1$ and the second output end $O_2$. Each of the on/off operations of the high-side switch HS and the low-side switch LS can be controlled according to the first pre-driving signal $S_{P1}$ and the second pre-driving signal $S_{P2}$ respectively, and an output signal $S_O$ is outputted via the output end OUT. As shown in FIG. 3, the high-side switch HS and the low-side switch LS can be respectively an n-type MOS transistors MNU and MNL which are connected in series with a totem pole form. Note that, when the load 308 is an inductive load, if the high-side switch HS and the low-side switch LS cannot continue to provide the current for the load 308 during a non-overlap time, an inductive current effect is introduced in the load 308 and a load inductive current $I_L$ occurs correspondingly. In such a condition, if the load inductive current $I_L$ passes through the parasitic diodes of the high-side switch HS or the low-side switch LS, the output signal $S_O$ may be sharply pulled up or down, resulting in ultra high slew rate for the output driving circuit 30 and the EMI problem. Therefore, the present invention can arrange the high-side switch HS or the low-side switch LS to be switched from the off state into the weak on state during the non-overlap time of the output driving circuit 30 to provide an appropriate discharge path for keeping the continuity of the load inductive current through the control operation of the control unit 306 when the load inductive current occurs through the control operation of the control unit. In a brief explanation, the present invention is capable of eliminating the load inductive current effect generated from the load 308 to prevent the EMI issue by controlling the high-side switch HS or the low-side switch LS.

Figure 4:
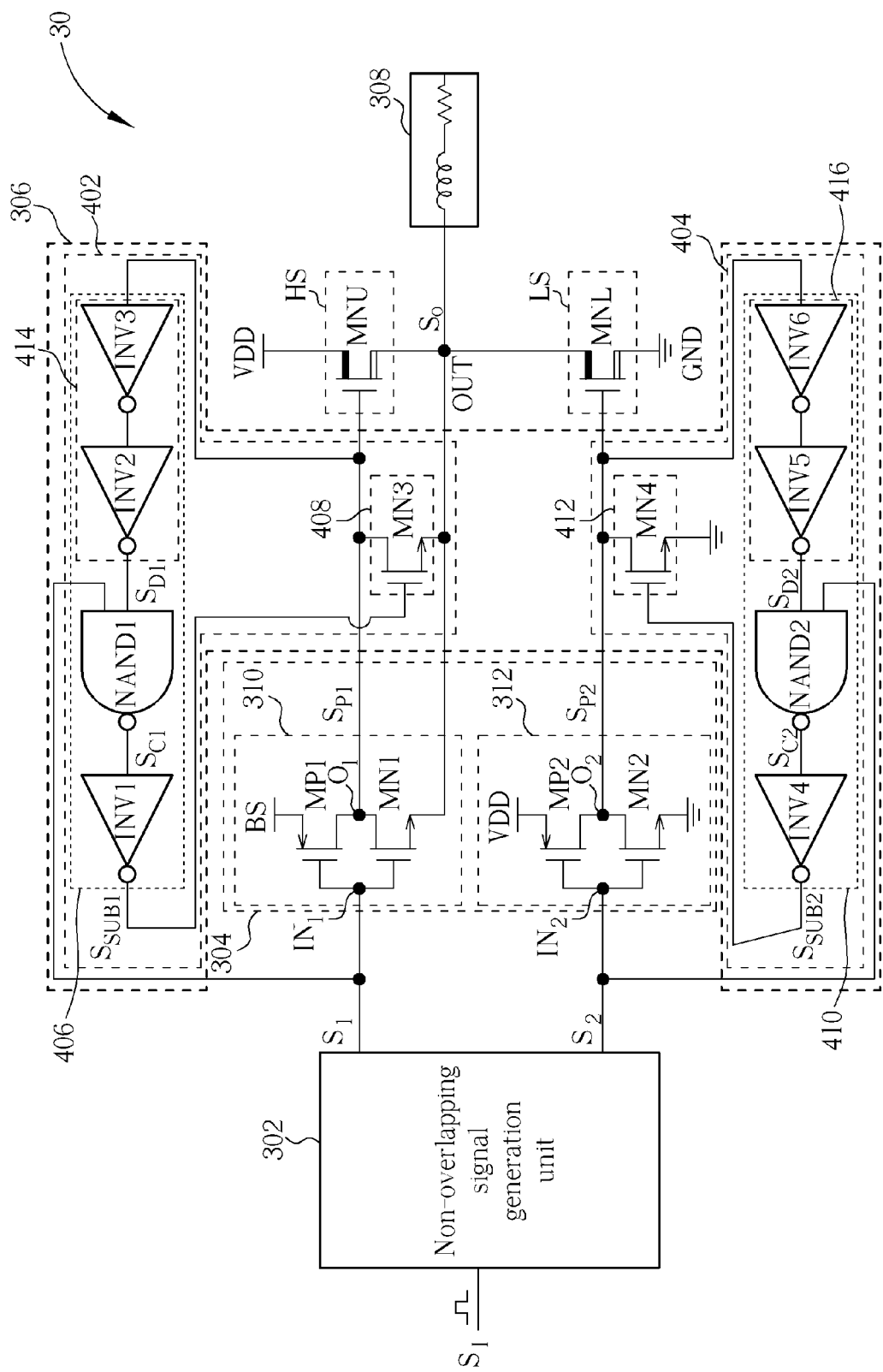
FIG. 4 is a schematic diagram of an output driving circuit according to a second embodiment of the present invention.

Moreover, regarding the control unit 306, please refer to FIG. 4, which is a schematic diagram of an output driving circuit 30 according to a second embodiment of the present invention. The control unit 306 includes a first auxiliary control unit 402 and a second auxiliary control unit 404. The first auxiliary control unit 402 is coupled to the non-overlapping signal generation unit 302 and the gate of the high-side switch HS for controlling the high-side switch HS to be switched into the weak on state according to the first non-overlapping signal $S_1$ and the first pre-driving signal $S_{P1}$. The second auxiliary control unit 404 is coupled to the non-overlapping signal generation unit 302 and the gate of the low-side switch LS for controlling the low-side switch LS to be switched into the weak on state according to the second non-overlapping signal $S_2$ and the second pre-driving signal $S_{P2}$. In the embodiment of the present invention, the weak on state is preferably fulfilled by parking the gate voltage of the high-side switch HS or the low-side switch LS in a sub-threshold voltage so that the high-side switch HS or the low-side switch LS operates in a sub-threshold region (also called a weak inversion region). In detail, the load inductive current effect occurred in the load 308 usually happens when the high-side switch HS or the low-side switch LS is switched from the on state into the off state. In other words, when the first pre-driving signal $S_{P1}$ is switched from High to Low, the high-side switch HS can be switched from the on state to the off state. In such a situation, through the operation of the first auxiliary control unit 402, the high-side switch HS will be re-switched from the off state into the weak on state for providing a current path to leak the load inductive current $I_L$. Therefore, the present invention is capable of controlling the high-side switch HS which has been or is about to be switched into the off state to be switched to the weak on state for leaking the load inductive current $I_L$ timely in order to reduce variation speed of the voltage level of the output end OUT and prevent the EMI Similarly, when the second pre-driving signal $S_{P2}$ is switched from High to Low, the low-side switch LS can be switched from the on state into the off state according to the second pre-driving signal $S_{P2}$. Through the operation of the second auxiliary control unit 404, the low-side switch LS will be re-switched from the off state into the weak on state for providing a current path to leak the load inductive current $I_L$ so as to reduce load inductive current effect of the load 308.

Please further refer to FIG. 4. The first auxiliary control unit 402 includes a first logic unit 406 and a first sub-threshold control unit 408. The first logic unit 406 is utilized for generating a first sub-threshold control signal $S_{SUB1}$ according to the first non-overlapping signal $S_1$ and the first pre-driving signal $S_{P1}$. To detail more, the first logic unit 406 includes a first signal delay unit 414, a first NAND gate NAND1, and a first inverter INV1. The first signal delay unit 414 is coupled to the gate of the high-side switch HS for delaying the first pre-driving signal $S_{P1}$ for a predetermined period D and generating a first delay signal $S_{D1}$. The first NAND gate NAND1 is utilized for performing a NAND logic operation on the first delay signal $S_{D1}$ and the first non-overlapping signal $S_1$ to generate a first logic control signal $S_{C1}$. As shown in FIG. 4, the first input terminal of the first NAND gate NAND1 is coupled to the first signal delay unit 414 for receiving the first delay signal $S_{D1}$. The second input terminal of the first NAND gate NAND1 is coupled to the non-overlapping signal generation unit 302 for receiving the first non-overlapping signal $S_1$. The output terminal of the first NAND gate NAND1 is utilized for outputting the first logic control signal $S_{C1}$. The first inverter INV1 is coupled to the output terminal of the first NAND gate NAND1 and the first sub-threshold control unit 408 for inverting the first logic control signal $S_{C1}$ to generate the first sub-threshold control signal $S_{SUB1}$.

Therefore, the first sub-threshold control unit 408 coupled to the first logic unit 406 and the gate of the high-side switch HS can perform the on/off operation according to the first sub-threshold control signal $S_{SUB1}$, and reduce the driving capability of the first pre-driver 310 when the first pre-driving signal $S_{P1}$ approaches a threshold voltage so that the gate voltage of the high-side switch HS will be pulled up due to charge injection effect and the high-side switch HS will be re-switched from the off state into the weak on state accordingly. Preferably, the first sub-threshold control unit 408 can be an n-type MOS transistor MN3 having a gate coupled to the output terminal of the first inverter INV1, a drain coupled to the gate of the high-side switch HS, and a source coupled to the output end OUT. As a result, when the first pre-driving signal $S_{P1}$ changes from high to low, the first auxiliary control unit 402 can make the high-side switch HS be switched into the weak on state according to the first non-overlapping $S_1$ and the first pre-driving signal $S_{P1}$ in order to provide a transient current path for leaking out the load inductive current $I_L$. In short, the present invention is capable of reducing high slew rate effectively and preventing EMI effect correspondingly.

Similarly, the second auxiliary control unit 404 includes a second logic unit 410 and a second sub-threshold control unit 412. In the second auxiliary control unit 404, the second logic unit 410 is utilized for generating a second sub-threshold control signal $S_{SUB2}$ according to the second non-overlapping signal $S_2$ and the second pre-driving signal $S_{P2}$. Please note that the first auxiliary control unit 402 shown in FIG. 4 with the same designations as those in the second auxiliary control unit 404 shown in FIG. 4 have similar operations and functions, further description thereof is omitted for brevity. The interconnections of the units are as shown in FIG. 4. The second logic unit 410 includes a second signal delay unit 416, a second NAND gate NAND2, and a fourth inverter INV4. The second signal delay unit 416 is coupled to the gate of the low-side switch LS for delaying the second pre-driving signal $S_{P2}$ for a predetermined period D and generating a second delay signal $S_{D2}$. The second NAND gate NAND2 is utilized for performing a NAND logic operation on the second delay signal $S_{D2}$ and the second non-overlapping signal $S_2$ to generate a second logic control signal $S_{C2}$. The fourth inverter INV4 is utilized for inverting the second logic control signal $S_{C2}$ to generate the second sub-threshold control signal $S_{SUB2}$. The second sub-threshold control unit 412 is utilized for performing the on/off operation according to the second sub-threshold control signal $S_{SUB2}$, and reducing the driving capability of the second pre-driver 312 when the second pre-driving signal $S_{P2}$ approaches a threshold voltage so that the gate voltage of the low-side switch LS will be pulled up due to charge injection effect and the low-side switch LS will be re-switched from the off state into the weak on state accordingly. Preferably, the second sub-threshold control unit 408 can be an n-type MOS transistor MN4. As a result, when the second pre-driving signal $S_{P2}$ changes from high to low, the second auxiliary control unit 404 can make the low-side switch LS be switched into the weak on state according to the second non-overlapping $S_2$ and the second pre-driving signal $S_{P2}$ in order to prove a transient current path for leaking out the load inductive current $I_L$.

In addition, as shown in FIG. 4, the first signal delay unit 414 uses the inverters INV2 and INV3 connected in series as a delay element, the second signal delay unit 416 uses the inverters INV5 and INV6 connected in series as a delay element, and those should not be a limitation of the present invention. Any kind of device which can provide a delay function is suitable for implementing the first signal delay unit 414 and the second signal delay unit 416.

Figure 5:
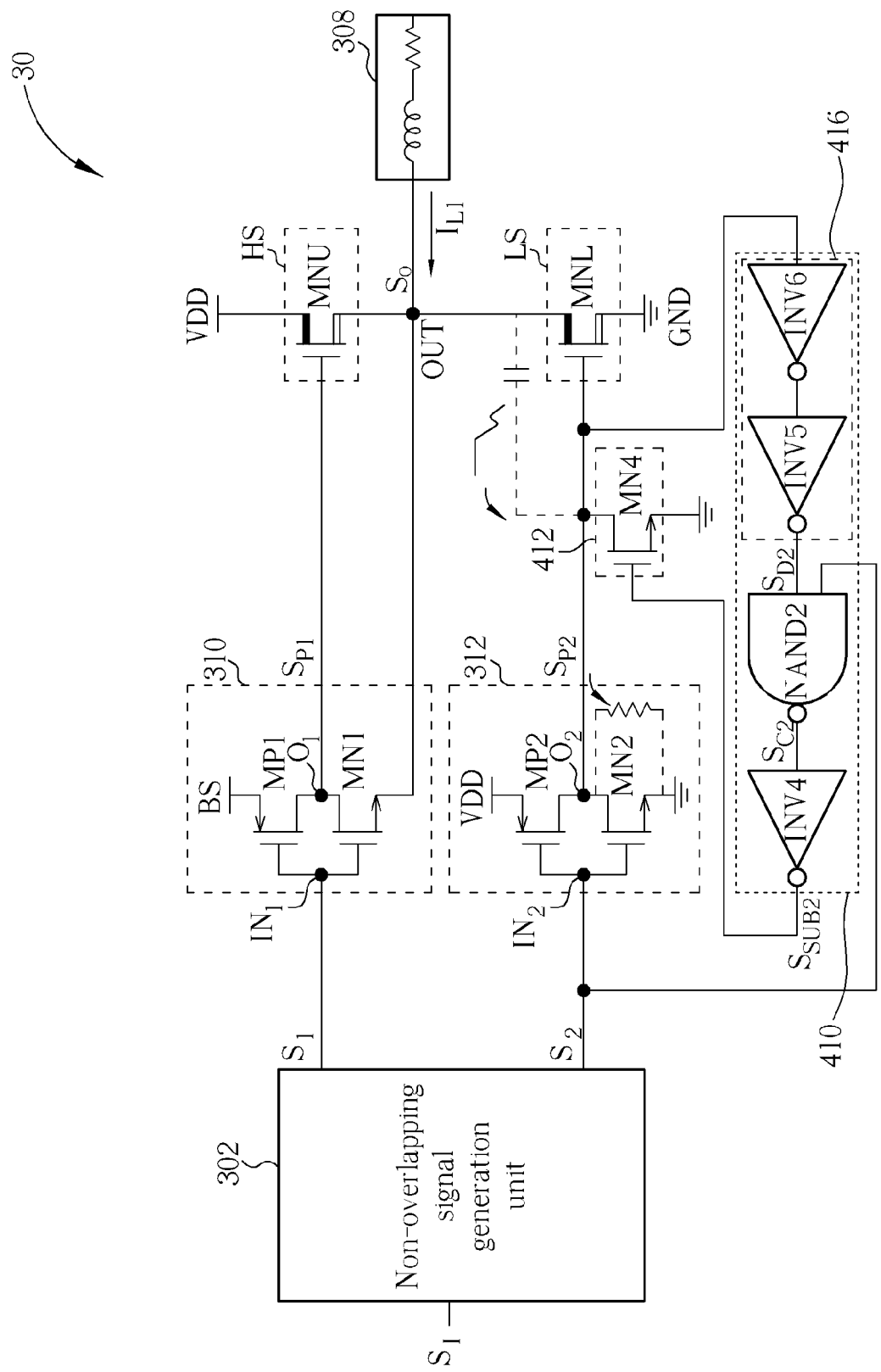
FIG. 5 is a schematic diagram of the output driving circuit shown in FIG. 4 when the input signal is switched from Low to High according to an embodiment of the present invention.
Figure 6:
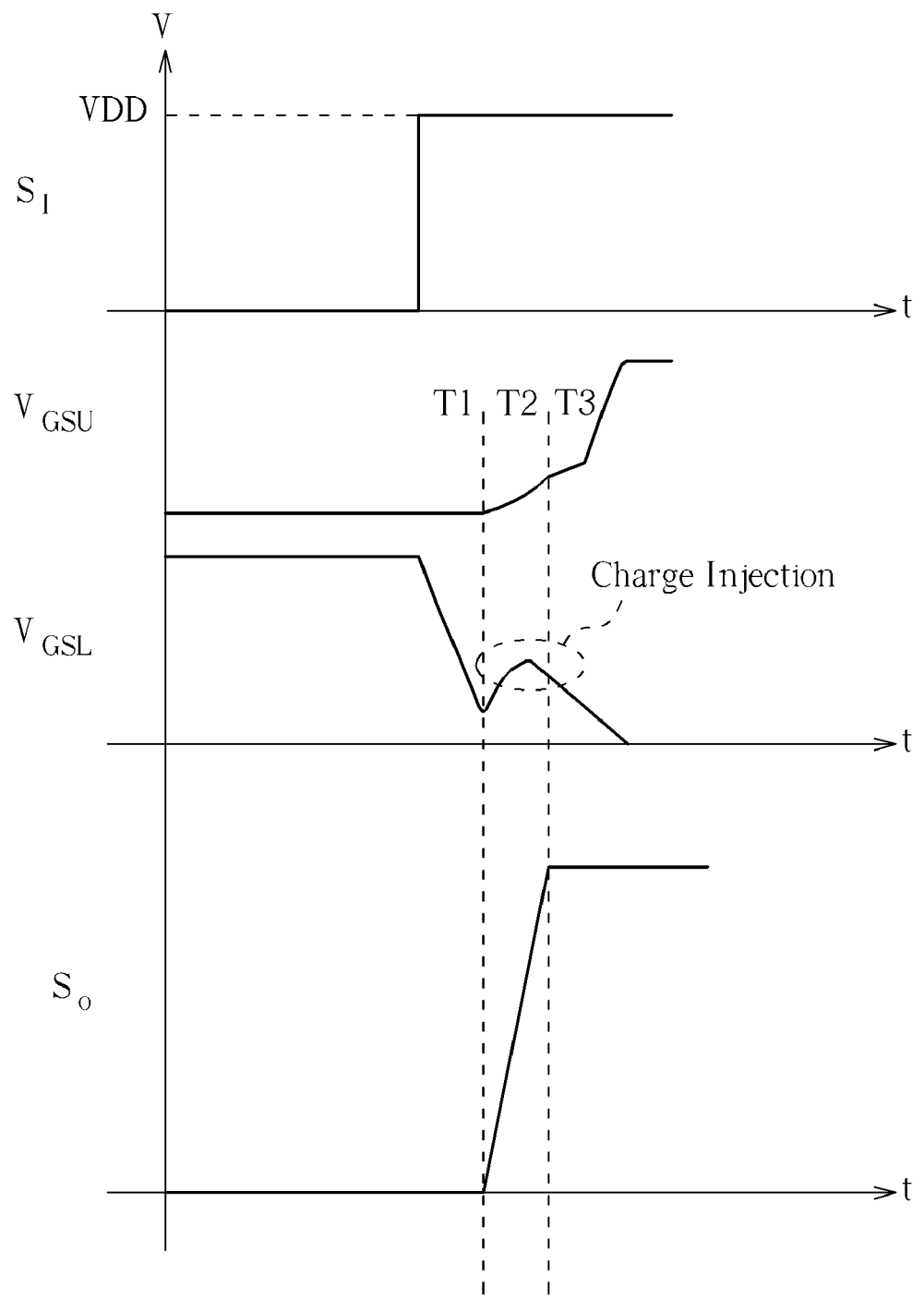
FIG. 6 is a schematic diagram of signal waveforms of the output driving circuit shown in FIG. 5 according to an embodiment of the present invention.

The following further elaborates the embodiment of the present invention with the operation of the output driving circuit 30. In the embodiment, suppose the voltage level of the power supply VDD represents high voltage level (High), and the voltage level of the ground end represents low voltage level (Low). As to the operation of the output driving circuit 30 when the input signal $S_1$ is switched from Low to High, please refer to FIG. 5 and FIG. 6. FIG. 5 is a schematic diagram of the output driving circuit 30 shown in FIG. 4 when the input signal $S_1$ is switched from Low to High according to an embodiment of the present invention. FIG. 6 is a schematic diagram of signal waveforms of the output driving circuit 30 shown in FIG. 5 according to an embodiment of the present invention. Before the input signal $S_1$ changes state, i.e. switched from Low to High, both the input signal $S_1$ and the second non-overlapping signal $S_2$ are at a low voltage level, and the first non-overlapping signal $S_1$ is at a high voltage level. Meanwhile, the first pre-driving signal $S_{P1}$ and second pre-driving signal $S_{P2}$ are respectively at a low voltage level and high voltage level. In such a condition, the gate voltage $V_{GSU}$ of the high-side switch HS is at a low voltage level and the gate voltage $V_{GSL}$ of the low-side switch LS is at a high voltage level so that the high-side switch HS is turned off (in an off sate), the low-side switch LS is turned on (in an on sate), and the output signal $S_O$ is at a low voltage. The first sub-threshold control unit 408 and the second sub-threshold control unit 412 are in an off state at the time.

When the input signal $S_1$ is switched from Low to High, the non-overlapping signal generation unit 302 is able to output a first non-overlapping signal $S_1$ with low voltage level and a second non-overlapping signal $S_2$ with high voltage level according to the input signal $S_1$ successively. Since the first non-overlapping signal $S_1$ is at a low voltage level, the first sub-threshold control unit 408 is capable of remaining in the off state. That means that the first auxiliary control unit 402 will not affect operation of the high-side switch HS during the switching transition period of high-side switch HS. Additionally, regarding the second logic unit 410, since the second non-overlapping signal $S_2$ is at a high voltage level, the second logic unit 410 can generate the second sub-threshold control signal $S_{SUB2}$ with high voltage level to make the second sub-threshold control unit 412 in the on state before the second delay signal $S_{D2}$ is changed to low voltage level. Moreover, because the second non-overlapping signal $S_2$ is at a high voltage level, the second pre-driving signal $S_{P2}$, i.e. the output of the second pre-driver 312, is being pulled down from the high voltage level. As shown in FIG. 6, during the time interval T1, the gate voltage $V_{GSL}$ of the low-side switch LS is pulled down from high voltage level correspondingly. As the gate voltage $V_{GSL}$ has already approached the threshold voltage of the low-side switch LS before the time interval T2, the low-side switch LS is switched into the off state. At this time, both the high-side switch LS and the low-side switch LS are in the off state, the load inductive current occurs. In detail, the second non-overlapping signal $S_2$ with high voltage level can be provided to the second logic unit 410, after a delay operation for a predetermined time, by the second signal delay unit 416 so that the second logic unit 410 can still generate the second sub-threshold control signal $S_{SUB2}$ with high voltage level to control the second sub-threshold control unit 412 in the on state at the beginning of the time interval T1. Furthermore, the second sub-threshold control signal $S_{SUB2}$ can be switched from high voltage level to low voltage level before the second pre-driving signal $S_{P2}$ is pulled down to the threshold voltage so as to control the second sub-threshold control unit 412 to be switched into the off state. Therefore, since the second sub-threshold control unit 412 is switched into the off state, the driving capability of the second pre-driver 312 becomes weaker than before. In other words, before entering the time interval T2, as the gate voltage $V_{GSL}$ has already approached the threshold voltage and the charge injection has occurred in the low-side switch LS, the weaker driving capability of the second pre-driver 312 lets the charge injection become worse than before so that the gate voltage $V_{GSL}$ is able to be re-raised up accordingly. In such a condition, the low-side switch LS which has been or is about to be switched into the off state can be re-switched (switched) into the weak on state for leaking the load inductive current $I_{L1}$. Compared with the transistor MN4, the transistor MN2 has a greater equivalent resistance between the drain and source. As a result, the load inductive current $I_{L1}$ flows through the gate-drain capacitance of the low-side switch LS and the transistor MN2 of the second pre-driver 312 to the ground end, and the above-mentioned operation is operated till the time interval T3, i.e. the end of the load inductive current effect. On the other hand, as shown in FIG. 5 and FIG. 6, the high-side switch HS will not be controlled by the first auxiliary control unit 402 and is able to perform the normal operation. Thus, the first pre-driving signal $S_{P1}$ is pulled up from the low voltage level during the time interval T2. As can been seen, the high-side switch HS will be turn on during the time interval T3. In short, the output signal $S_O$ will not be affected by the load inductive current and is capable of being switch from Low to High slowly and gradually.

Figure 7:
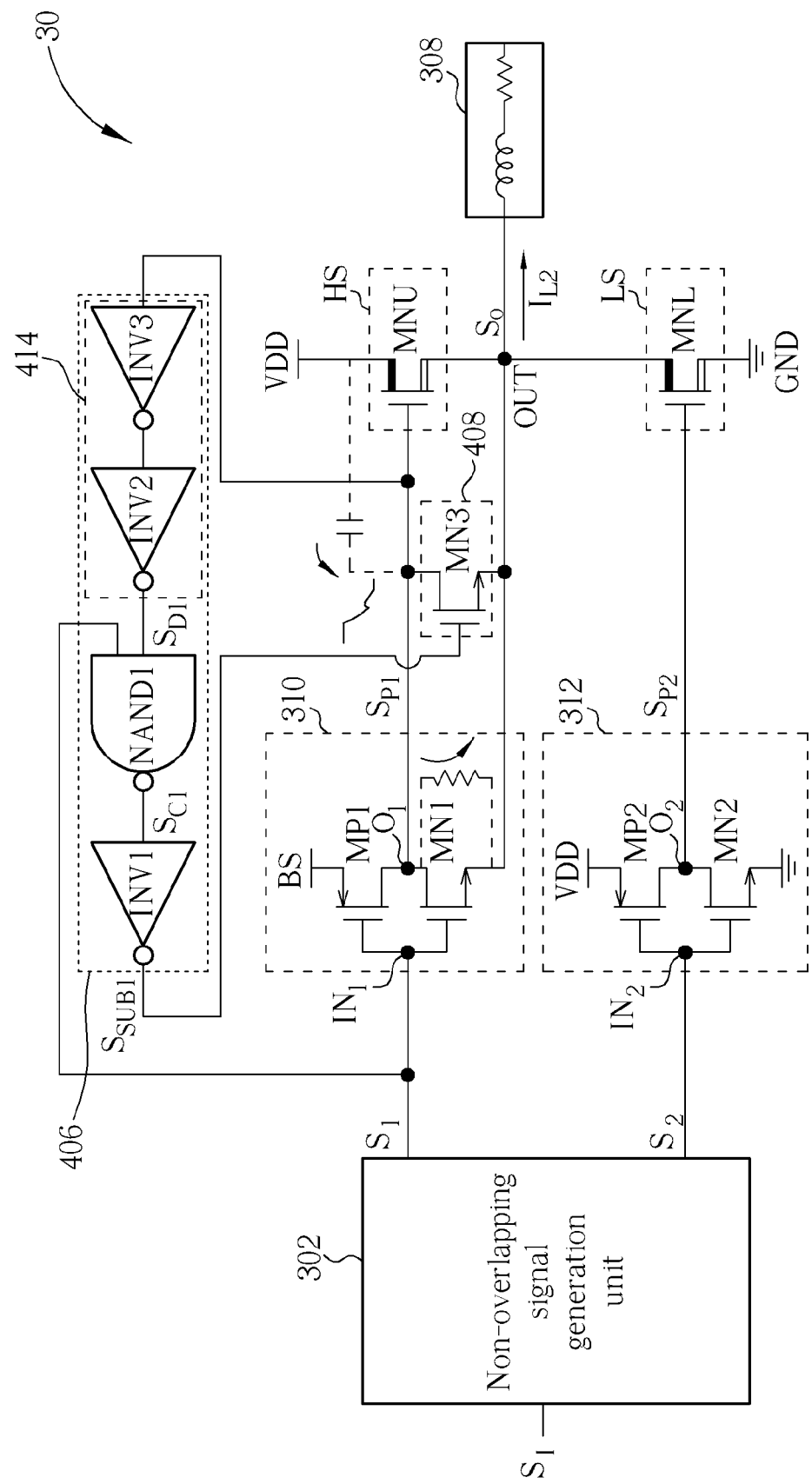
FIG. 7 is a schematic diagram of the output driving circuit shown in FIG. 4 when the input signal is switched from High to Low according to an embodiment of the present invention.
Figure 8:
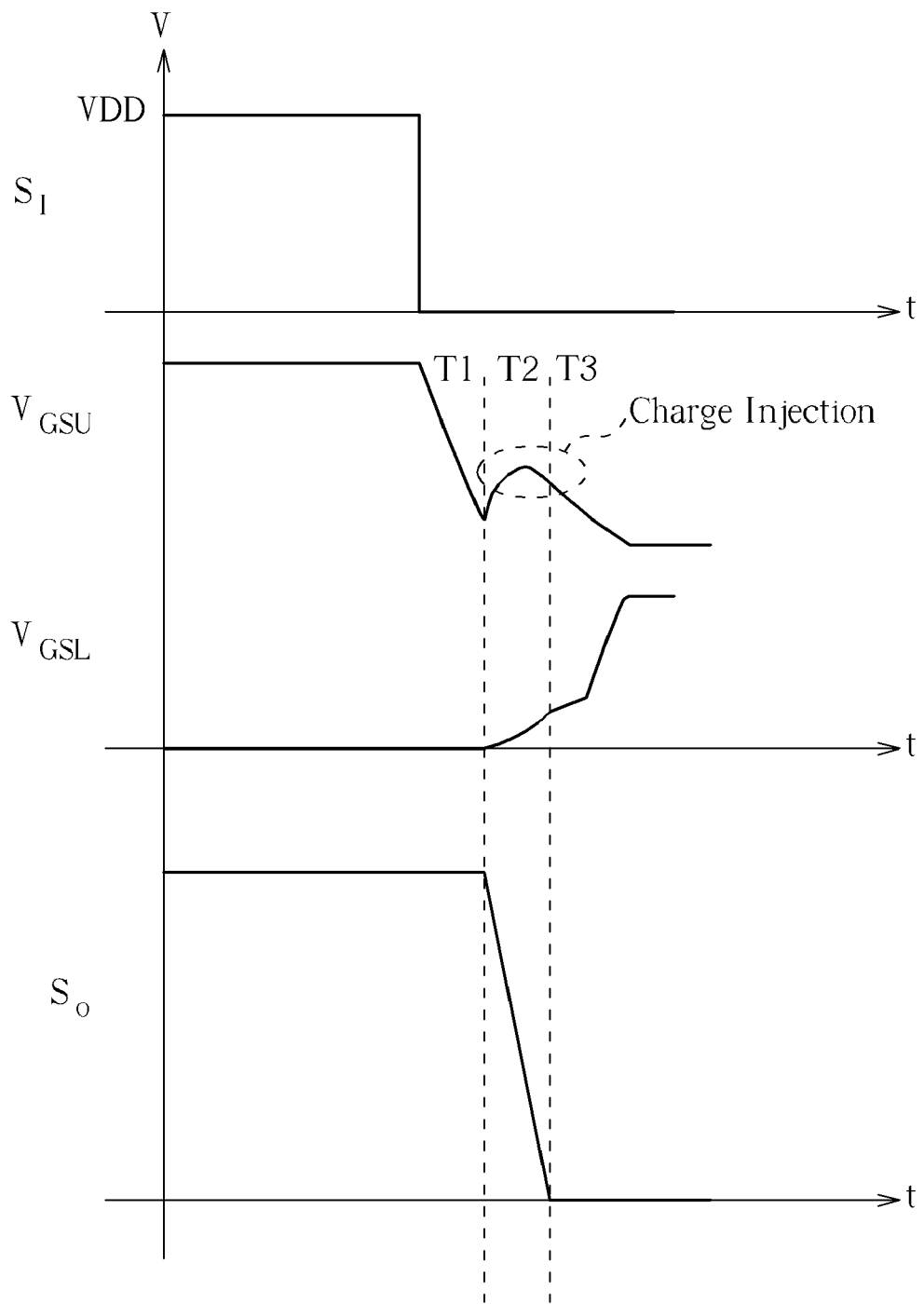
FIG. 8 is a schematic diagram of signal waveforms of the output driving circuit shown in FIG. 7 according to an embodiment of the present invention.

Furthermore, as to the operation of the output driving circuit 30 when the input signal $S_1$ is switched from High to Low, please refer to FIG. 7 and FIG. 8. FIG. 7 is a schematic diagram of the output driving circuit 30 shown in FIG. 4 when the input signal $S_1$ is switched from High to Low according to an embodiment of the present invention. FIG. 8 is a schematic diagram of signal waveforms of the output driving circuit 30 shown in FIG. 7 according to an embodiment of the present invention. Before the input signal $S_1$ is switched from High to Low, both the input signal $S_1$ and the second non-overlapping signal $S_2$ are at a high voltage level, and the first non-overlapping signal $S_1$ is at a low voltage level. Meanwhile, the first pre-driving signal $S_{P1}$ and second pre-driving signal $S_{P2}$ are respectively at a high voltage level and low voltage level. In such a condition, the gate voltage $V_{GSL}$ of the low-side switch LS is at a high voltage level and the gate voltage $V_{GSL}$ of the low-side switch LS is at a low voltage level so that the high-side switch HS is in an on sate, the low-side switch LS is in an off sate, and the output signal $S_O$ is at a high voltage. The first sub-threshold control unit 408 and the second sub-threshold control unit 412 are in an off state at the time.

When the input signal $S_1$ is switched from High to Low, the non-overlapping signal generation unit 302 is able to output a first non-overlapping signal $S_1$ with high voltage level and a second non-overlapping signal $S_2$ with low voltage level according to the input signal $S_1$ successively. Since the second non-overlapping signal $S_1$ is at a low voltage level, the second sub-threshold control unit 412 is capable of remaining in the off state. That means that the second auxiliary control unit 404 will not affect operation of the low-side switch LS during the switching transition period of low-side switch LS. Additionally, regarding the first logic unit 406, since the first non-overlapping signal $S_1$ is at a high voltage level, the first logic unit 406 can generate the first sub-threshold control signal $S_{SUB1}$ with high voltage level to make the first sub-threshold control unit 408 be in the on state before the first delay signal $S_{D1}$ is changed to low voltage level. Moreover, because the first non-overlapping signal $S_1$ is at a high voltage level, the first pre-driving signal $S_{P1}$, i.e. the output of the first pre-driver 310, is being pulled down from the high voltage level. As shown in FIG. 8, during the time interval T1, the gate voltage $V_{GSU}$ of the high-side switch HS is pulled down from high voltage level correspondingly. Before the time interval T2, the gate voltage $V_{GSU}$ has already approached the threshold voltage of the high-side switch HS, the high-side switch HS is switched into the off state. At this time, both the high-side switch LS and the low-side switch LS are in the off state, the load inductive current occurs. In detail, the first non-overlapping signal $S_1$ with high voltage level can be provided to the first logic unit 406, after a delay operation for a predetermined time, by the first signal delay unit 414 so that the first logic unit 406 can still generate the first sub-threshold control signal $S_{SUB1}$ with high voltage level to control the first sub-threshold control unit 408 in the on state at the beginning of the time interval T1. Furthermore, the first sub-threshold control signal $S_{SUB1}$ can be switched from high voltage level to low voltage level before the first pre-driving signal $S_{P1}$ is pulled down to the threshold voltage so as to control the first sub-threshold control unit 410 to be switched into the off state. Therefore, since the first sub-threshold control unit 408 is switched into the off state, the driving capability of the first pre-driver 310 becomes weaker than before. In other words, before entering the time interval T2, as the gate voltage $V_{GSU}$ has already approached the threshold voltage and the charge injection has occurred in the high-side switch HS, the weaker driving capability of the first pre-driver 310 lets the charge injection become worse than before so that the gate voltage $V_{GSU}$ is able to be re-raised up accordingly. In such a condition, the high-side switch HS which has been or is about to be switched into the off state can be re-switched (switched) into the weak on state for leaking the load inductive current $I_{L2}$. Compared with the transistor MN3, the transistor MN1 has a greater equivalent resistance between the drain and source. As a result, the load inductive current $I_{L2}$ flows through the gate-drain capacitance of the high-side switch HS and the transistor MN1 of the first pre-driver 310, and the above-mentioned operation is operated till the time interval T3, i.e. the end of the load inductive current effect. On the other hand, as shown in FIG. 7 and FIG. 8, the low-side switch LS will not be controlled by the second auxiliary control unit 404 and is able to perform normal operations. Thus, the second pre-driving signal $S_{P2}$ is pulled up from the low voltage level during the time interval T2. As can been seen, the low-side switch LS will be turned on during the time interval T3. In short, the output signal $S_O$ will not be affected by the load inductive current and is capable of being switch from High to Low slowly and gradually.

In summary, when the load inductive current occurs, the output driving circuit of the present invention can use the high-side switch or the low-side switch to provide an appropriate discharge path for keeping the continuity of the load inductive current through the control operation of the control unit so as to decrease the variation speed of the output voltage. Therefore, the present invention can reduce the inductive current effect and prevent the EMI effetely.

Those skilled in the art will readily observe that numerous modifications and alterations of the device and method may be made while retaining the teachings of the invention.

What is claimed is:

1. An output driving circuit capable of reducing EMI effect, comprising:
   a non-overlapping signal generation unit, for generating a first non-overlapping signal and a second non-overlapping signal according to an input signal;
   a pre-driver, coupled to the non-overlapping signal generation unit, for generating a first pre-driving signal and a second pre-driving signal according to the first non-overlapping signal and the second non-overlapping signal;
   a high-side switch, comprising a first terminal coupled to the pre-driver for receiving the first pre-driving signal, a second terminal coupled to a first power end, and a third terminal for controlling an electrical connection between the second terminal of the high-side switch and the third terminal end of high-side switch;
   a low-side switch, comprising a first terminal coupled to the pre-driver for receiving the second pre-driving signal, a second terminal, and a third terminal coupled to a ground end for controlling an electrical connection between the second terminal of the low-side switch and the third terminal end of the low-side switch;
   an output end, coupled to the third terminal of the high-side switch, the second terminal of the low-side switch, and a load, for outputting an output signal; and
   a control unit, coupled to the non-overlapping signal generation unit, the high-side switch, and the low-side switch for controlling the high-side switch or the low-side switch to be switched into a weak on state to reduce load inductive current effect caused by the load according to the first non-overlapping signal, the second non-overlapping signal, the first pre-driving signal and the second pre-driving signal.

2. The output driving circuit of claim 1, wherein the pre-driver comprises:
   a first pre-driver, coupled to the non-overlapping signal generation unit and the first terminal of the high-side switch, for generating the first pre-driving signal according to the first non-overlapping signal; and
   a second pre-driver, coupled to the non-overlapping signal generation unit and the first terminal of the low-side switch, for generating the second pre-driving signal according to the second non-overlapping signal.

3. The output driving circuit of claim 2, wherein the first pre-driver comprises:
   a first input end, coupled to the non-overlapping signal generation unit, for receiving the first non-overlapping signal;
   a first output end, coupled to the first terminal end of the high-side switch;
   a p-type metal-oxide-semiconductor (MOS) transistor, comprising a gate coupled to the first input end, a drain coupled to the first output end, and a source coupled to a second power end; and
   an n-type MOS transistor, comprising a gate coupled to the first input end, a drain coupled to the first output end, and a source coupled to the output end.

4. The output driving circuit of claim 2, wherein the second pre-driver comprises:
   a second input end, coupled to the non-overlapping signal generation unit, for receiving the second non-overlapping signal;
   a second output end, coupled to the first terminal end of the low-side switch;
   a p-type MOS transistor, comprising a gate coupled to the second input end, a drain coupled to the second output end, and a source coupled to the first power end; and
   an n-type MOS transistor, comprising a gate coupled to the second input end, a drain coupled to the second output end, and a source coupled to the ground end.

5. The output driving circuit of claim 1, wherein the high-side switch is an n-type MOS transistor, the first terminal of the high-side switch is a gate, the second terminal of the high-side switch is a drain, and the third terminal of the high-side switch is a source.

6. The output driving circuit of claim 1, wherein the low-side switch is an n-type MOS transistor, the first terminal of the low-side switch is a gate, the second terminal of the low-side switch is a drain, and the third terminal of the high-side switch is a source.

7. The output driving circuit of claim 1, wherein the control unit comprises:
   a first auxiliary control unit, coupled to the non-overlapping signal generation unit and the first terminal of the high-side switch, for controlling the high-side switch to be switched into the weak on state according to the first non-overlapping signal and the first pre-driving signal; and
   a second auxiliary control unit, coupled to the non-overlapping signal generation unit and the first terminal of the low-side switch, for controlling the low-side switch to be switched into the weak on state according to the second non-overlapping signal and the second pre-driving signal.

8. The output driving circuit of claim 7, wherein the first auxiliary control unit is switched to an off state before the first pre-driving signal is pulled down to a threshold voltage to reduce driving capability of the first pre-driver and the high-side switch is switched to the weak on state to provide a transient current path for a load inductive current caused by the load.

9. The output driving circuit of claim 7, wherein the first auxiliary control unit comprises:
a first logic unit, coupled to the non-overlapping signal generation unit and the first terminal of the high-side switch, for generating a first sub-threshold control signal according to the first non-overlapping signal and the first pre-driving signal; and
a first sub-threshold control unit, coupled to the first logic unit and the first terminal of the high-side switch, for performing an on or off operation to switch the high-side switch into the weak on state.

10. The output driving circuit of claim 9, wherein the first logic unit comprises:
a first signal delay unit, coupled to the first terminal of the high-side switch, for delaying the first pre-driving signal for a predetermined period and generating a first delay signal;
a first NAND gate, for performing a NAND logic operation on the first delay signal and the first non-overlapping signal to generate a first logic control signal, wherein the first NAND gate comprises:
a first input terminal, coupled to the first signal delay unit, for receiving the first delay signal;
a second input terminal, coupled to the non-overlapping signal generation unit, for receiving the first non-overlapping signal; and
an output terminal, for outputting the first logic control signal; and
a first inverter, coupled to the output terminal of the first NAND gate and the first sub-threshold control unit, for inverting the first logic control signal to generate the first sub-threshold control signal.

11. The output driving circuit of claim 10, wherein the first signal delay unit comprises:
a second inverter, coupled to the first terminal of the high-side switch and the first input terminal of the first NAND gate, for generating an inverted first pre-driving signal according the first pre-driving signal; and
a third inverter, coupled to the second inverter and the first input terminal of the first NAND gate, for inverting the inverted first pre-driving signal to generate first delay signal.

12. The output driving circuit of claim 10, wherein the first sub-threshold control unit is an n-type MOS transistor, comprising a gate coupled to the first inverter, a drain coupled to the first terminal of the high-side switch, and a source coupled to the output end.

13. The output driving circuit of claim 7, wherein the second auxiliary control unit is switched to an off state before the second pre-driving signal is pulled down to a threshold voltage to reduce driving capability of the second pre-driver and the low-side switch is switched to the weak on state to provide a transient current path for a load inductive current caused by the load.

14. The output driving circuit of claim 7, wherein the second auxiliary control unit comprises:
a second logic unit, coupled to the non-overlapping signal generation unit and the first terminal of the low-side switch, for generating a second sub-threshold control signal according to the second non-overlapping signal and the second pre-driving signal; and
a second sub-threshold control unit, coupled to the second logic unit and the first terminal of the low-side switch, for performing an on or off operation to switch the low-side switch into the weak on state.

15. The output driving circuit of claim 14, wherein the second logic unit comprises:
a second signal delay unit, coupled to the first terminal of the low-side switch, for delaying the second pre-driving signal for a predetermined period and generating a second delay signal;
a second NAND gate, for performing a NAND logic operation on the second delay signal and the second non-overlapping signal to generate a second logic control signal, wherein the second NAND gate comprises:
a first input terminal, coupled to the second signal delay unit, for receiving the second delay signal;
a second input terminal, coupled to the non-overlapping signal generation unit, for receiving the second non-overlapping signal; and
an output terminal, for outputting the second logic control signal; and
a fourth inverter, coupled to the output terminal of the second NAND gate and the second sub-threshold control unit, for inverting the second logic control signal to generate the second sub-threshold control signal.

16. The output driving circuit of claim 15, wherein the second signal delay unit comprises:
a fifth inverter, coupled to the first terminal of the low-side switch and the first input terminal of the second NAND gate, for generating an inverted second pre-driving signal according the second pre-driving signal; and
a sixth inverter, coupled to the fifth inverter and the first input terminal of the second NAND gate, for inverting the inverted second pre-driving signal to generate second delay signal.

17. The output driving circuit of claim 15, wherein the second sub-threshold control unit is an n-type MOS transistor, comprising a gate coupled to the fourth inverter, a drain coupled to the first terminal of the low-side switch, and a source coupled to the ground end.

* * * * *